(12) United States Patent
Leard et al.

(10) Patent No.: US 6,371,662 B1
(45) Date of Patent: *Apr. 16, 2002

(54) SPATIALLY VARIABLE FILTER LASER WAVELENGTH MONITORING/CONTROL

(75) Inventors: Francis L. Leard, Sudbury; Scott Burroughs, Acton; Ilya Mirman, Lowell, all of MA (US)

(73) Assignee: Corning Lasertron, Inc., Bedford, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/563,084

(22) Filed: May 1, 2000

Related U.S. Application Data (63) Continuation of application No. PCT/US98/25142, filed on Nov. 24, 1998, which is a continuation-in-part of application No. 08/979,204, filed on Nov. 26, 1997, now Pat. No. 6,120,190.

(51) Int. Cl.[7] .............................. G02B 6/42; H01S 3/131
(52) U.S. Cl. ........................ 385/88; 359/888; 359/889; 372/32; 372/34; 372/38.01
(58) Field of Search ................. 385/88, 92; 372/32–34, 372/36, 38, 38.1–38.09; 359/888, 889, 891

(56) References Cited

U.S. PATENT DOCUMENTS

| | | | |
|---|---|---|---|
| 3,746,429 A | * 7/1973 | Spindel et al. .............. 359/888 |
| 4,503,541 A | * 3/1985 | Weller et al. .............. 372/32 X |
| 4,807,227 A | 2/1989 | Fujiwara et al. ............... 370/3 |
| 4,815,081 A | 3/1989 | Mahlein et al. ............... 372/32 |
| 4,923,270 A | 5/1990 | Carter ..................... 350/96.18 |
| 4,925,273 A | * 5/1990 | Maisenbacher et al. ..... 359/888 |
| 5,173,794 A | 12/1992 | Cheung et al. ............. 359/127 |
| 5,299,212 A | 3/1994 | Koch et al. .................... 372/32 |
| 5,384,799 A | 1/1995 | Osterwalder ................. 372/32 |
| 5,394,489 A | 2/1995 | Koch ........................... 385/14 |
| 5,457,760 A | 10/1995 | Mizrahi ........................ 385/37 |
| 5,602,394 A | 2/1997 | Dombrowski et al. . 250/339.02 |
| 5,943,349 A | * 8/1999 | Ohta .......................... 372/32 X |
| 5,956,356 A | 9/1999 | Bergmann et al. ............. 372/32 |
| 5,970,076 A | 10/1999 | Hamada ........................ 372/20 |
| 6,120,190 A | * 9/2000 | Leard et al. ................... 385/88 |

FOREIGN PATENT DOCUMENTS

| | | |
|---|---|---|
| EP | 0 310 000 A2 | 4/1989 |
| EP | 0 466 403 A1 | 1/1992 |
| EP | 0 762 677 A2 | 3/1997 |
| EP | 0 939 470 A2 | 1/1999 |
| WO | WO 95/08206 | 3/1995 |

OTHER PUBLICATIONS

Rowlands, Scott F. and Swaby, Basil L., "Have you considered using variable bandpass filters?," *Laser Focus World*, (pp. 113–118) Sep. 1989.

Santec Marketing Material of Optical Filters (No date given).

Villeneuve, B., et. al., "High–Stability Wavelength–Controlled DFB Laser Sources for Dense WDM Applications", *OFC '98 Technical Digest, Friday Morning*, pp. 381–382. Feb. 1998.

\* cited by examiner

Primary Examiner—John D. Lee
(74) Attorney, Agent, or Firm—Hamilton Brook Smith & Reynolds, P.C.

(57) ABSTRACT

A feedback controlled laser diode communication device is disclosed that, as is common, has a laser diode that is modulated in response to an input signal to generate an optical signal, encoding the input signal. Spatially variable passband filter material, however, is arranged to receive at least a portion of the optical signal generated by the laser diode, preferably from the rear facet, and at least one detector is used to detect the thus filtered optical signal. Control circuitry then controls a wavelength of the laser diode based upon the response of the detector(s) to thus provide feedback control. As such, the device is particularly applicable to maintaining the tight channel spacings found in wavelength division multiplexed systems.

15 Claims, 6 Drawing Sheets

SPATIALLY VARIABLE FILTER LASER WAVELENGTH MONITORING/CONTROL

RELATED APPLICATIONS

This application is a Continuation of Application No. PCT/US98/25142, filed Nov. 24, 1998, which designated the United States, and which is a Continuation-in-Part application of U.S. Ser. No. 08/979,204, filed Nov. 26, 1997 (now U.S. Pat. No. 6,120,190), the entire teachings of which are incorporated herein by this reference.

BACKGROUND OF THE INVENTION

In order to increase data throughput without the installation of new fiberoptic links, Wavelength Division Multiplexing (WDM) systems are being deployed. These systems rely on the tunability of semiconductor lasers to access a wider portion of the spectrum that optical fibers propagate. This can result in an increase in data rates by an order of magnitude or more.

Standards have been promulgated for the channel spacings in these WDM systems. The frequency spacings are tight for optical frequencies. For laser diodes operating at around 1.5 micrometers ($\mu$m), it is typically 100 gigaHertz (GHz); this translates to an approximately 0.8 nanometers (nm) minimum wavelength channel spacing. Newer standards are emerging, which, in some cases, have even tighter channel slots.

How the laser diodes are tuned to operate in the various channels of the WDM systems depends on the specific types of laser diodes used. The wavelength of distributed feedback (DFB) laser diodes is tuned by changing the temperature of the diodes. Temperature control is typically implemented in the context of laser communication modules with a thermoelectric cooler. These devices extract heat using Peltier effect in a manner that can be electrically modulated. Fabry-Perot lasers are similarly tuned by controlling their temperature. Distributed Bragg (DBR) lasers are tuned by temperature and injection current. Tuning across broader ranges is accomplished by varying the laser diode's structure, such as by changing grating frequency.

Solutions have been proposed for maintaining the proper channel spacing in these WDM systems. The proposals typically rely on precise factory calibration, due to inherent manufacturing variability in distributed feedback lasers, for example, and manual fine tuning of the WDM module wavelength after installation to detect and adjust for wavelength shifts from aging and environmental effects.

SUMMARY OF THE INVENTION

The present invention concerns wavelength feedback control and/or monitoring for laser diode systems. As such, it is particularly applicable to maintaining the tight channel spacings found in WDM systems. The invention is unique in its reliance on spatially variable filter material to determine or monitor the laser diode's wavelength. This class of light filter provides specific advantages based upon its compact and tunable nature, which facilitates the implementation of WDM devices in small well-regulated modules.

In general, according to one aspect, the invention features a feedback controlled laser communication device. As is common, the device comprises a laser diode or laser amplifier that is modulated or the output of which is modulated in response to an input signal to generate an optical signal, encoding the input signal. Spatially variable filter material, however, is arranged to receive at least a portion of the optical signal generated by the laser device, and a detector can be used to detect the thus filtered optical signal. Monitoring and possibly control circuitry then use the response of the detector(s) to thus determine wavelength and potentially provide feedback control.

In a preferred embodiment, the spatially variable filter material has a spatially varying passband. Alternatively, spatially varying low pass, high pass, or narrow bandpass notch filter material could be substituted as well as transmissive or reflective filter material.

Further, the detectors are not strictly necessary. The variable filter material can be used to provide narrow frequency feedback into an amplifier for tunable narrow frequency operation.

Also in the preferred embodiment, the spatially variable filter material and at least one detector are arranged to filter and detect light from a rear facet of the laser diode or amplifier. In this way, the total usable power output of the device is not reduced, essentially relying on the free rear facet light, in the case of the diode. In other implementations, however, light from the front facet could be sampled on a partial or periodic basis or during factory calibration.

In a first embodiment, at least two detectors are actually used. This configuration enables the detection of light above and below, respectively, an assigned center wavelength for the device. The control circuitry tunes the wavelength of the laser diode to maintain a predetermined relationship between magnitudes of the responses from the detectors. Moreover, the power output of the laser diode can be modulated or controlled in dependence on the combined responses of the detectors.

This embodiment provides certain ease and flexibility in manufacturing the devices. The placement of the two detectors will determine the response cross-over point in the filter output. The location of the cross-over wavelength is adjusted by moving either detector with respect to the other, such that the response increases and crossover wavelength changes, or both equally with respect to the midpoint, such that the response increases but crossover wavelength is static.

Two detectors, however, are not necessary. In a second embodiment, a single detector is arranged relative to the spatially variable filter material so that its active area changes spatially with the filter. The wavelength is then controlled to maintain a predetermined response from the detector.

In another single detector embodiment, a linear charge coupled device is used. Each element represents a single wavelength bin.

According to another aspect, the invention also features a wavelength-division multiplexed laser diode communication system, which comprises a plurality of channel subsystems. Each subsystem uses the spatially variable filter material in the wavelength feedback control scheme.

In some implementations of the system, the spatially variable filter material is shared between subsystems such that a single spatially variable filter is used for multiple subsystems. Moreover, detector arrays such as charge coupled devices may be used in control schemes of multiple subsystems.

In general, according to still other aspects, the invention relates to a method for controlling laser diode communication system using spatially variable filter material. Additionally, the material may be used to calibrate wavelength-division multiplexed optical communication systems.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, like reference characters refer to the same parts throughout the different views. The drawings are not necessarily to scale, emphasis instead being placed upon illustrating the principles of the invention.

DETAILED DESCRIPTION OF THE PREFERRED EMBODIMENTS

Figure 1:
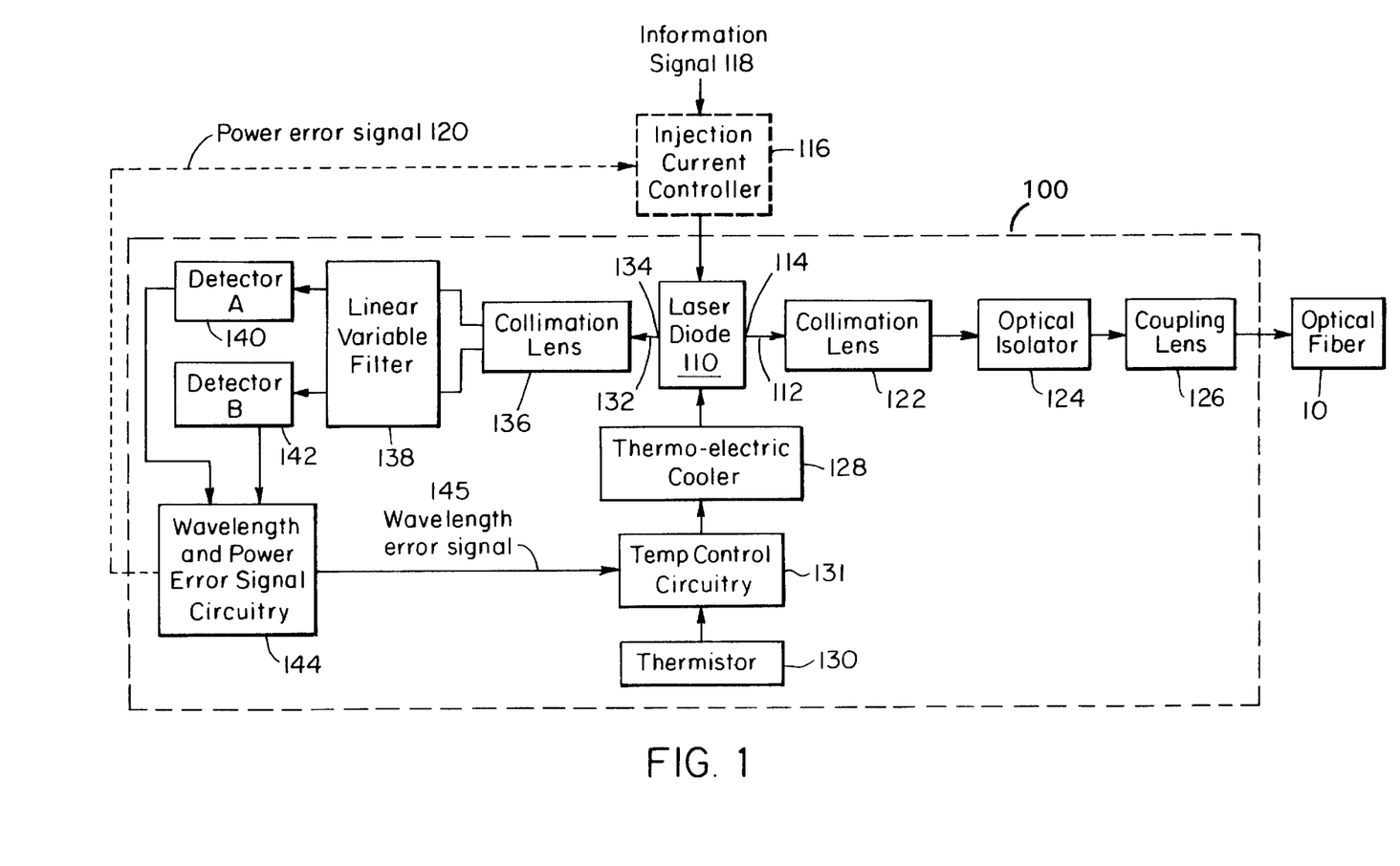
FIG. 1 is a block diagram showing a laser diode communication device according to the present invention.

FIG. 1 is a block diagram of a laser diode communication device 100, which has been constructed according to the principles of the present invention. As is common in these devices, a laser diode 110 generates an optical signal 112 at its front, partially- or non-reflecting facet 114. In one embodiment, the laser diode is a distributed feedback laser that is tunable in a range surrounding 1.5 µm.

Information is encoded into the optical signal 112 by modulating the laser diode's injection current in response to an information signal 118. Specifically, an injection current controller 116, typically external to the communications device 100, receives the information signal 118 and a feedback power error signal 120 from the device 100. The controller 116 modulates the injection current of the laser diode 110 both to encode the information signal and maintain nominal, predetermined output optical powers to conform with both the device's damage thresholds and user design specifications.

It should be noted, however, that the invention also applies to other modulated laser light systems. For example, in alternative embodiments, the laser can be replaced with a laser diode and discrete modulator. Typically, in such systems, the laser runs nominally in a cw mode with the information signal being provided to the modulator.

The optical signal 112 is transmitted via an optical fiber 10 that is typically external to the communications device 100 or connected as a fiber pigtail. Collimating lens 122 and coupling lens 126 are used to couple the optical signal 112 into the optical fiber for transmission in a typical embodiment. Optical isolator 124, typically comprising two polarizers and an intervening Faraday rotator, is used to provide isolation. Alternatively, however, other coupling system can be substituted. Fiber-pigtail endface lens can be used with or without the discrete polarizers/rotators/isolators, depending on the intended application.

As is also common, the temperature of the laser diode 110 is controlled by a thermo-electric cooler 128. These devices are used to extract heat from or heat the laser diodes to maintain a constant, controlled operating temperature and thus stable wavelength for the optical signal 112. A thermistor 130 is used to detect the temperature of the laser diode 110. It generates a temperature signal that is received by temperature control circuitry 131 that uses both the wavelength error signal and the temperature signal to modulate the operation of the thermoelectric cooler 128 to heat or cool the laser diode. During a power-up interval, the laser diode's wavelength is tunes so that it falls within the capture range of the detector scheme (140, 142). During normal operation, the temperature control circuitry 131 controls the thermo-electric cooler 128 to track the desired wavelength. During this operation, however, the thermistor is monitored to ensure that the temperature does exceed high and/or low temperature thresholds such that the laser diode or other circuitry could be damaged.

According to the present invention, at least a portion 132 of the optical signal is monitored to detect the laser diode's instantaneous wavelength of operation. In the context of the illustrated example, the optical signal is conveniently sampled by detecting light exiting from the rear, reflecting facet 134 of the laser diode 110. In a preferred embodiment, the sampled portion 132 of the optical signal is passed through a collimation lens 136. From there, the sampled light is filtered by a spatially variable filter 138. In the preferred embodiment, the filter 138 is constructed from linearly variable filter material, which has a passband that changes linearly in the x direction across the face of the filter.

In this embodiment, two detectors, detector A 140 and detector B 142, detect the filtered optical signal through two different locations on the filter 138. Indications of the respective detectors' responses are provided to wavelength and power error signal circuitry 144. This circuitry generates a wavelength error signal 145 typically based on the difference between the response of detector A 140 and the response of detector B 142 to control the thermoelectric cooler 128 via the temperature control circuitry 131. The circuitry 144 also generates the power error signal 120 that is available to the user external to the device and used by the injection current controller 116. The power error signal 120 is preferably based on the combined responses of the detectors 140, 142.

Figure 2:
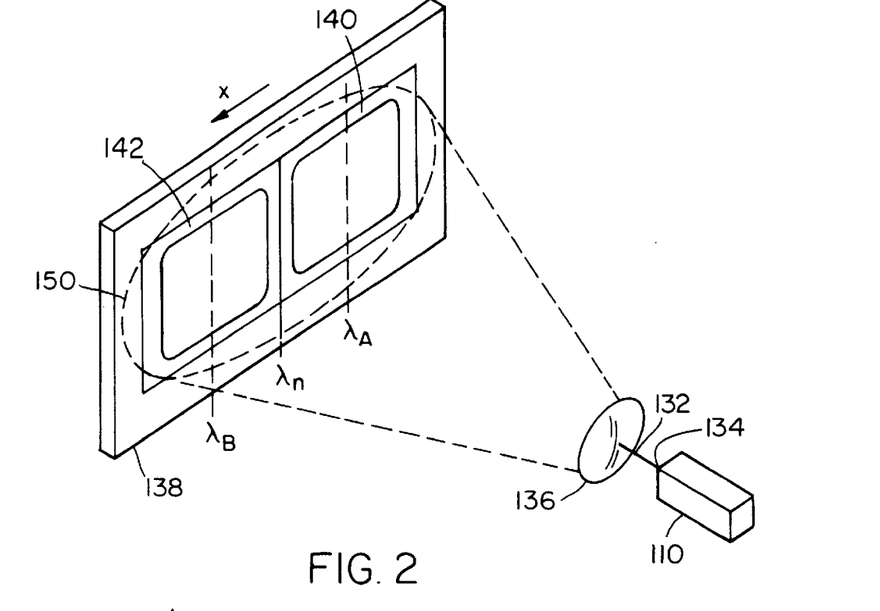
FIG. 2 is a schematic perspective view of the filter and detector arrangement in the inventive communications device.

FIG. 2 shows the arrangement of the spatially variable filter 138 and detectors 140, 142. Specifically, light 132 from the rear facet 134 of the laser diode 110 passes through collimating lens 136 to form a preferably oval illuminated region 150 on a single, unitary piece of spatially variable filter material 138. The detectors 140, 142 are arranged side by side behind the filter 138. In a preferred embodiment, the filter is approximately 500 micrometers long and provides a shift of 0.8 micrometers in wavelength across its face.

Figure 3:
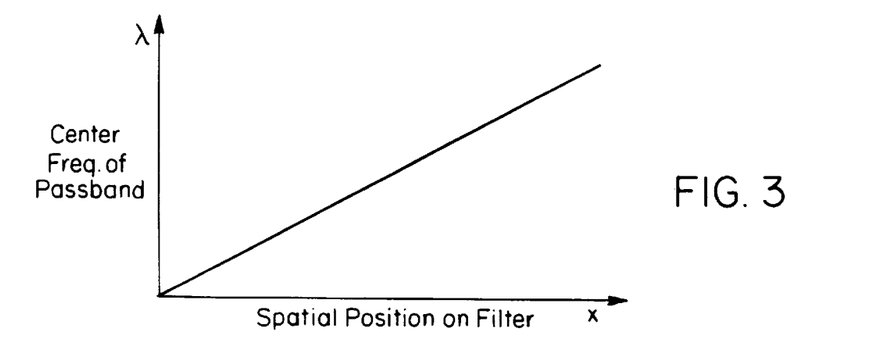
FIG. 3 is a plot of the center frequency passband as a function of spatial filter position for spatially variable filter material.

FIG. 3 is a plot of the center frequency passband as a function of spatial position x on the spatially variable filter material. The center frequency passband for the filter material is dependent on the spatial position on the filter. In the illustrated example, the passband increases in wavelength for increases in the spatial position across the filter.

Figure 4:
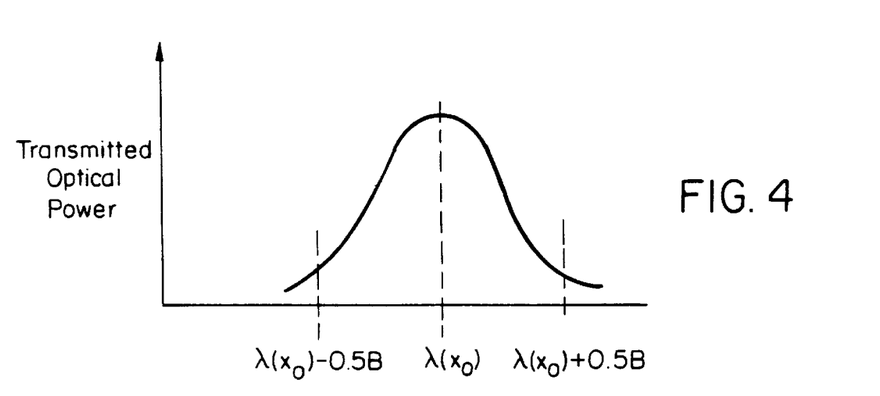
FIG. 4 is a plot of transmitted optical power as a function of wavelength for the spatially variable filter material at an arbitrary position $X_0$.

FIG. 4 illustrates an exemplary passband, plotting transmitted optical power as a function of wavelength. At a given position on the filter material $X_0$, there is a unique center frequency for the filter material's passband, $\lambda(X_0)$. The filter material also has a defined passband width (B) that is relatively constant. This passband defines the transmitted wavelengths of light at a given location in the filter material. Specifically, substantially only light between $\lambda(X_0)$−0.5B to $\lambda(X_0)$+0.5B is transmitted at spatial location $X_0$.

Figure 5:
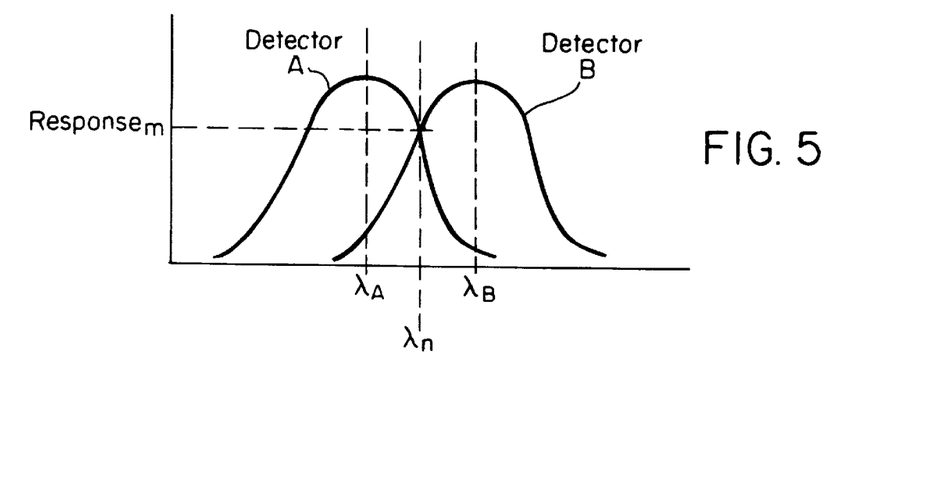
FIG. 5 is a plot of the detectors' responses as a function of the optical signal from the laser diode.

FIG. 5 shows the spectrums to which detector A 140 and detector B 142 are responsive due to their placement with respect to the filter material 138. Specifically, detector A 140 is located in front of the spatially variable filter material 138 such that it has a passband centered around wavelength $\lambda_A$. Detector B 142 is located in front of a different portion of the filter material 138 and thus has a passband to which it is responsive centered, around the wavelength $\lambda_B$. In the control scheme of the preferred embodiment, the assigned wavelength of the communications device 100 is $\lambda_n$, which, in one specific implementation, is halfway between $\lambda_B$ and $\lambda_A$. As a result, the wavelength and power error circuitry 144 generates a wavelength error signal to control the diode's wavelength, which in the illustrated embodiment is achieved via thermo-electric cooler 128. The responses of the detectors 140, 142 are balanced, thus providing feedback control to maintain the laser diode's wavelength at $\lambda_n$.

The configuration of this embodiment provides particular ease and flexibility of manufacturing. The placements of the two detectors will determine the response crossover point in the filter output. Both the response (intensity m at crossover) and location of the cross-over wavelength $\lambda_n$ can be adjusted by moving either detector with respect to the other. This changes the response intensity and $\lambda_n$. Alternatively, the locations of both detectors can be moved equally with respect to the midpoint. The response increases or decreased depending on whether the detectors were moved towards or away from each other, respectively, but $\lambda_n$ is static.

In a related vein, moving the filter material 138 with respect to the detector pair, changes $\lambda_A$, $\lambda_n$, $\lambda_B$ to accommodate different assigned wavelengths without compromising the relationships in sensitivity afforded by the original detector set up. This feature has particular importance relative to manufacturing inventories required to supply laser units for a WDM system having many, 45–90, or more, channels. A generic module can be produced that works across a range of potential channels. Generally, a particular DFB laser can be manufactured such that it can be potentially tuned over twelve channels, for example. This generic module is stocked. When a module for a particular channel is required, the generic module covering the channel is selected and the variable filter installed and adjusted/set such that the module works at the desired frequency.

Figure 6:
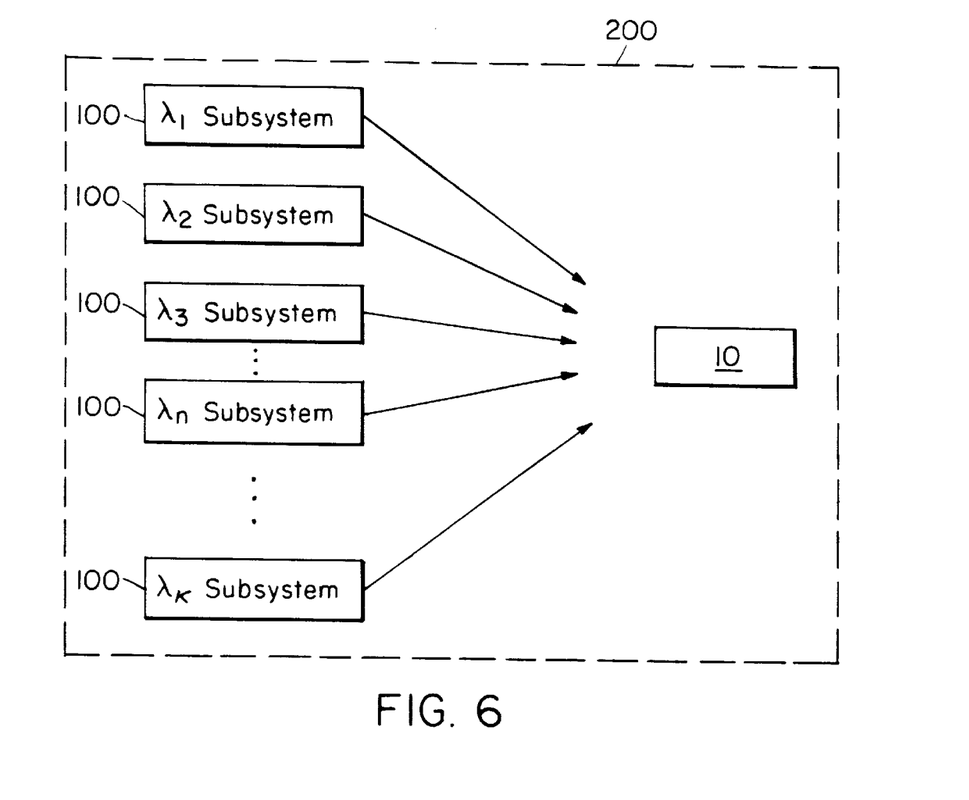
FIG. 6 is a block diagram illustrating the implementation of the inventive laser diode communication devices as channel subsystems in a wavelength division multiplexed laser diode communication system.

FIG. 6 shows an implementation of the communication device 100 as channel subsystems in a wavelength division multiplex module 200. In such a system, the laser diode of each subsystem is controlled to operate at a different wavelength $\lambda_1$–$\lambda_k$ within the tunability of the laser diode technology. For example, one proposed system, the laser diodes nominal center frequencies stretch from 195.9 to 191.7 TeraHertz (THz), with minimum channel spacings of 100 gigahertz. The corresponding wavelengths centers stretch from 1530.33 to 1563.86 nm, with an approximately 0.8 nanometer spacing. In such systems, tens to hundreds of separate channels are conveyed in the same single mode optical fiber 10, yielding vast increases in the total data transmission rates of the fiber relative to non-multiplexed systems.

When the devices are implemented together in a module 200 certain components may be shared between subsystems 100. For example, the discrete detectors 140, 142 in each subsystem are replaced with detector arrays or charged coupled device (CCD) arrays in some implementations to reduce the cost of the module. Further, a single strip of filter material is used for the entire module. Each of the specific subsystems accesses only a portion of the strip. Additionally, the wavelength error signal circuitry may be distributed between subsystems as separately functioning circuits or unified control of all subsystems may be provided with shared analog/digital controller circuitry.

Figure 7:
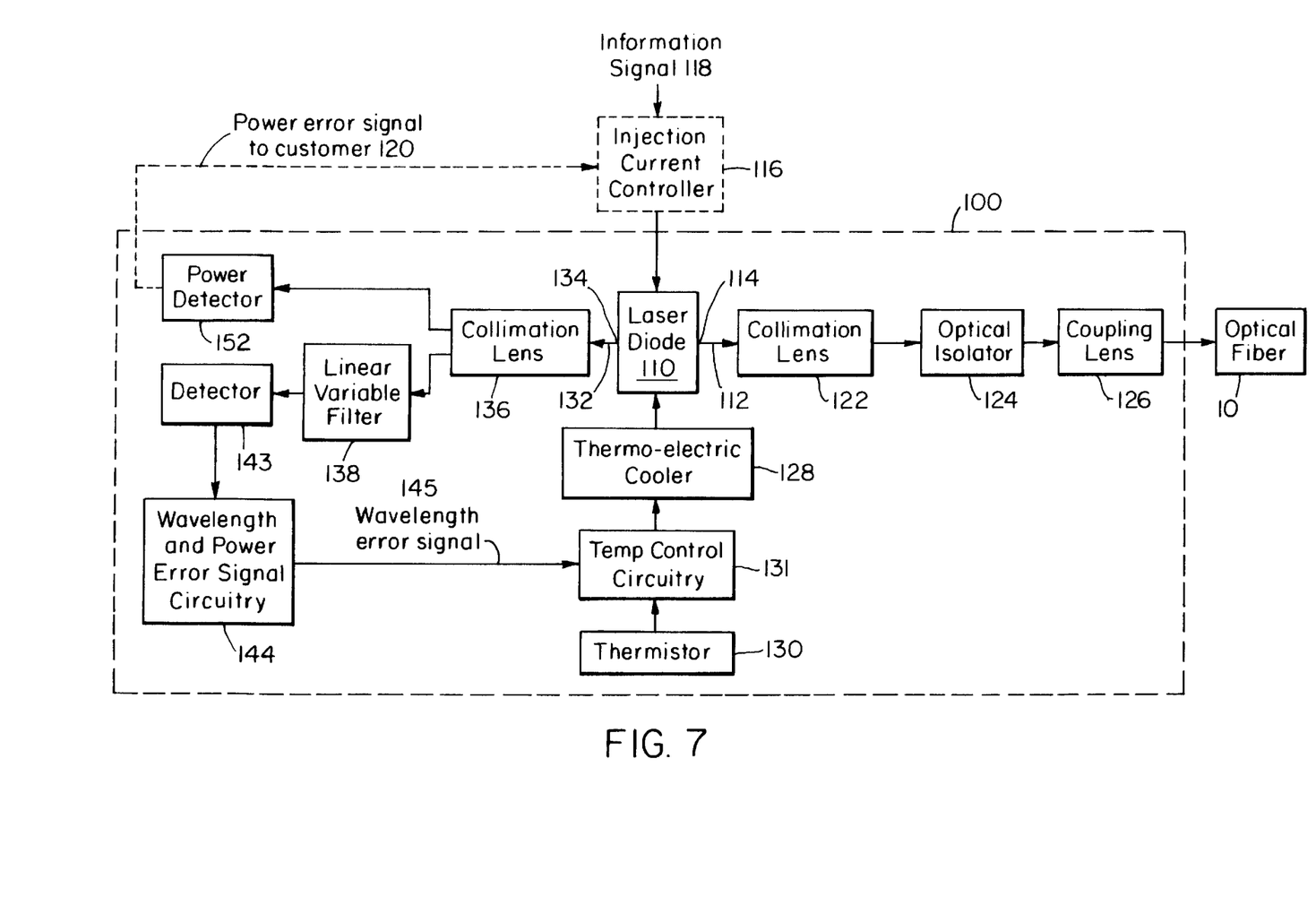
FIG. 7 is a block diagram of a laser diode communication device according to a second embodiment of the invention.

FIG. 7 is a block diagram of a second embodiment of the laser diode communication device. This embodiment differs insofar as it uses a single detector 143. This detector 143 is arranged relative to the variable filter 138 such that the magnitude of its response varies with the varying wavelength from the sampled optical signal 132.

Figure 8:
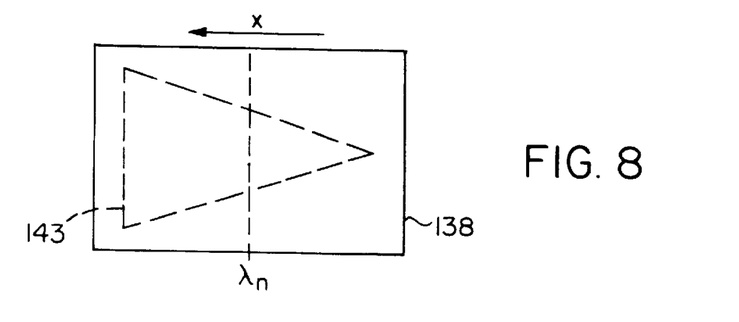
FIG. 8 is a plan view of the arrangement between the detector and spatially variable filter material in the second embodiment of the communications device.

FIG. 8 is a block diagram of the detector 143 and spatially variable filter 138. The detector 143 itself, or a discrete stop for the detector, is shaped in the direction of the filter's spatial variability to provide wavelength dependent operation. For example, if the wavelength of the laser diode 110 were to increase, the transmissive portion of the filter material 138 shifts in the positive x direction. In the positive x direction, the active area of filter 143 increases so that it is more responsive for a given wavelength. As a result, the wavelength error signal circuitry 145 modulates the thermoelectric cooler 128 such that the detector's response is held at a predetermined level. In the illustrated example, the circuitry 145 modulates the diode's temperature to track a wavelength of $\lambda_n$.

Returning to FIG. 7, since the detector 143 can not easily be used for power control, a separate power detector 152 to required to generate the power error signal 120.

In other embodiments, the CCD-type detectors are used. These, preferably linear-type, CCD elements are arranged to extend in the direction of the variability in the spatially variable filter material. Each element of CCD represents a separate wavelength bin. The wavelength of the laser diode is then controlled to maintain a predetermined relationship in the intensity signals detected in each of the bins.

Although the invention has been described for use in combination with distributed feedback lasers, it is broadly applicable to other types of laser diode devices or other wavelength tunable lasers. For example, temperature controlled laser devices such as Fabry-Perot lasers and distributed Bragg reflector lasers could also be used. Further, external cavity lasers that are wavelength tuned by adjusting an intra-cavity grating is another alternative. In such an implementation, the wavelength error signal is used to control an actuating element, e.g., piezo-electric device, that physically rotates the grating to tune wavelength.

Figure 9:
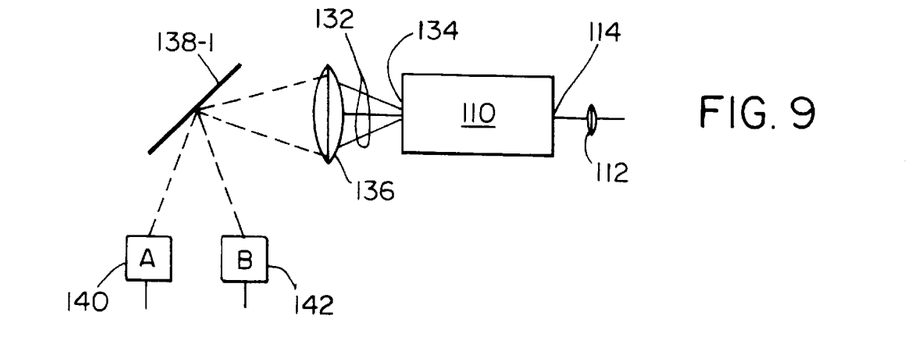
FIG. 9 is a schematic block diagram showing an alternative implementation using reflective spatially variable filter material.

FIG. 9 shows another embodiment of the present invention that uses reflective spatially variable filter material, in which the variability of interest is in the light that is reflected, rather than transmitted through, the filter material. Specifically, the light 132 emitted from the laser diode's rear facet 134 is collimated by lens 136 and then redirected, as a fold mirror, by the spatially variable filter 138-1. In one arrangement, detector A 140 and detector B 142 receive the light to provide power and error signals 120, 145 as described previously. Depending on the implementation, the spatially variable filter material 138-1 is a notch, linear-variable filter, or alternatively, a low or high pass, or bandpass filter material.

Figure 10:
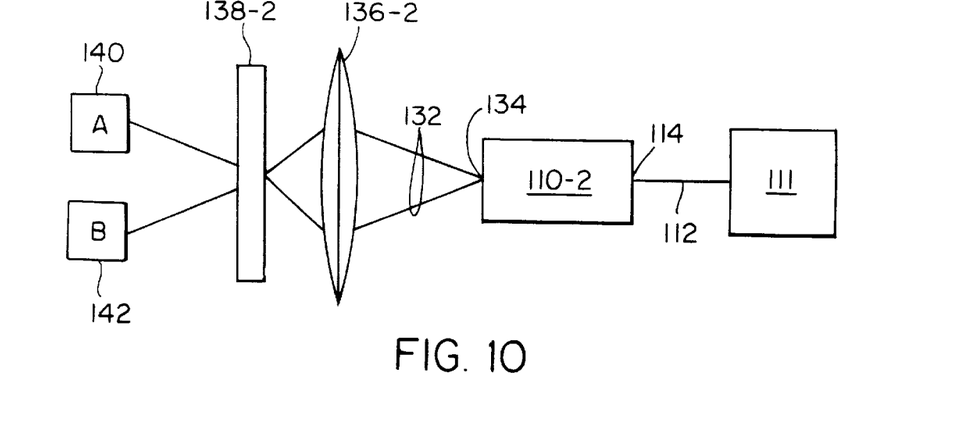
FIG. 10 is another embodiment using an semiconductor amplifier with a notch linearly variable filter material for specific wavelength locking operation.

FIG. 10 shows still another embodiment of the present invention in a tunable laser device configuration. In this embodiment, a laser amplifier 110-2 replaces the laser diode. Light 112 generated in the amplifier 110-2 is transmitted to a modulator 111. In a preferred embodiment, the modulator has a coated, partially reflective facet, which defines the output facet of the resonator. Light 132 exiting out of the other end of the amplifier 110-2 is focused by lens 136-2 onto spatially variable filter material 138-2. Specifically, the spatially variable filter material 138-2 is notch, linearly, linearly variable filter (NLVF), which is reflective at only a narrow band of frequencies at each location along the filter material. These reflective frequencies are spatially variable across the entire length of the filter material, preferably in a linear fashion. In the preferred embodiment, the light exiting from the rear facet 134 of the amplifier 110-2 is focused or collimated onto the NLVF 138-2. This generates a narrow bandwidth feedback into the amplifier 110-2 to generate an essentially single frequency laser. As a result, the laser amplifier will lock onto this reflected wavelength range.

One advantage of this design is the ease at which its wavelength monitoring, control is performed. Since the two spatially separated detectors 140, 142 behind the NLVF 138-2 will act differentially due to their placement, a control scheme is based upon a subtraction, or difference between the response of detector A 140 and detector B 142. One advantage of this system is the need for a phase compensator as avoid, which is common to Fabry-Perot-style lasers.

Figure 11:
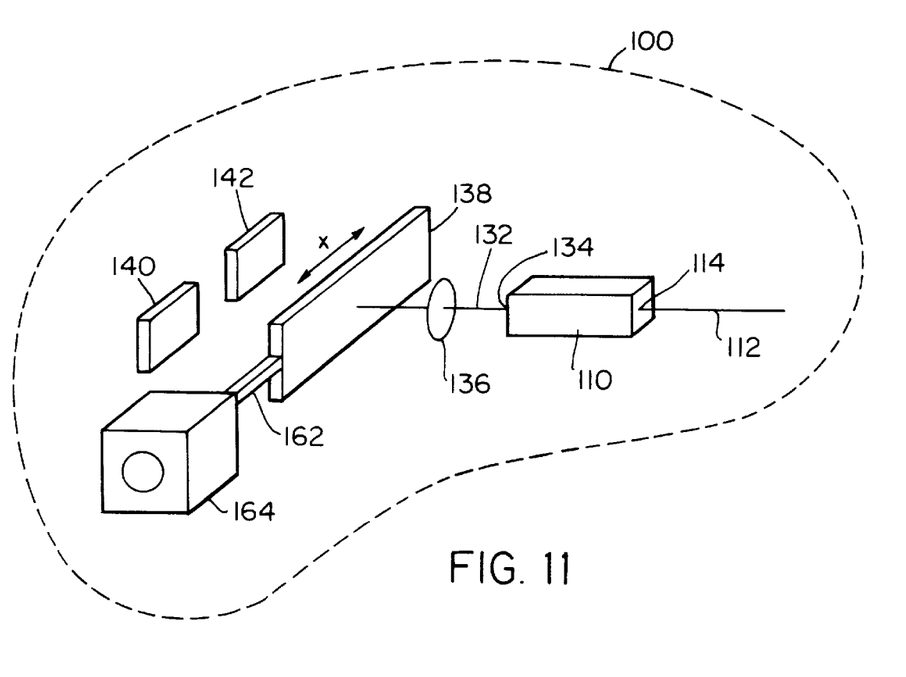
FIG. 11 is a schematic perspective view in which the spatially variable filter material is tunable using an actuator in the module.

Finally, FIG. 11 shows one potential modification to the previously disclosed embodiments. In some cases, it may be desirable to fix spatially variable filter material at the time of manufacture to set the frequency of operation for the device. This is analogous to set-and-forget approach. Alternatively, the invention can be tunable post-manufacture by the user. Specifically, a filter actuator 164 is connected to the spatially variable filter material 138 via an arm 162, which allows movement of the linear variable filter material 138 along the x-axis, i.e., sliding movement. In one implementation, the actuator 164 is a simple set screw, a head of which is preferably accessible external to the module. Alternatively, microelectrical mechanical system type actuators (MEMS) are possible along with other approaches such as smart films, memory metals, and piezo-crystal based systems to provide active, electronically controlled tuning in either an open or closed loop control scheme.

While this invention has been particularly shown and described with references to preferred embodiments thereof, it will be understood by those skilled in the art that various changes in form and details may be made therein without departing from the spirit and scope of the invention as defined by the appended claims. Those skilled in the art will recognize or be able to ascertain using no more than routine experimentation, many equivalents to the specific embodiments of the invention described specifically herein. Such equivalents are intended to be encompassed in the scope of the claims.

What is claimed is:

1. An optical communication device, comprising:
 a semiconductor optoelectronic device that generates light;
 filter material, having spatially varying spectral filtering characteristics, that is arranged to filter at least a portion of the light generated by the semiconductor optoelectronic device;
 at least one detector that detects a portion of the light that was filtered by the filter material; and
 an adjustment system that controls where the light from the semiconductor optoelectronic device interacts with the filter material.

2. An optical communication device as claimed in claim 1, wherein the adjustment system translates the filter material perpendicularly relative to a direction of travel of the light.

3. An optical communication device as claimed in claim 1, wherein the filter material feeds back light into the semiconductor optoelectronic device to control a wavelength of operation.

4. An optical communication device as claimed in claim 1, wherein the adjustment system is calibrated and then set.

5. An optical communication device as claimed in claim 1, wherein the adjustment system comprises a mechanically controlled actuation system.

6. An optical communication device as claimed in claim 1, wherein the adjustment system is electronically controllable.

7. An optical communication device as claimed in claim 6, wherein the filter material feeds back light into the semiconductor optoelectronic device to control a wavelength of operation.

8. An optical communication device as claimed in claim 6, wherein the adjustment system is closed-loop controlled.

9. An optical communication device as claimed in claim 8, wherein the filter material feeds back light into the semiconductor optoelectronic device to control a wavelength of operation.

10. An optical communication device as claimed in claim 6, wherein the adjustment system is open-loop controlled.

11. An optical communication device as claimed in claim 6, wherein the adjustment system comprises a micromechanical system.

12. An optical communication device as claimed in claim 6, wherein the adjustment system comprises a piezoelectronic system.

13. A laser communication device, comprising:
 a laser amplifier that amplifies light;
 a modulator that modulates the light in response to an information signal; and
 reflective bandpass variable filter material arranged to feedback light into the laser amplifier.

14. A laser communication device as claimed in claim 13, wherein the filter material produces narrowed frequency operation.

15. A laser communication device as claimed in claim 13, wherein the bandpass variable filter material is notch variable filter material.

* * * * *